United States Patent
Shinohara

(10) Patent No.: US 9,947,620 B2
(45) Date of Patent: Apr. 17, 2018

(54) SEMICONDUCTOR MEMORY DEVICE

(71) Applicant: TOSHIBA MEMORY CORPORATION, Minato-ku (JP)

(72) Inventor: Hiroshi Shinohara, Yokosuka (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/457,201

(22) Filed: Mar. 13, 2017

(65) Prior Publication Data
US 2017/0271263 A1 Sep. 21, 2017

(30) Foreign Application Priority Data
Mar. 17, 2016 (JP) .................. 2016-053649

(51) Int. Cl.
*G11C 16/04* (2006.01)
*H01L 23/528* (2006.01)
*H01L 27/11556* (2017.01)
*H01L 27/11582* (2017.01)

(52) U.S. Cl.
CPC .... *H01L 23/5283* (2013.01); *H01L 27/11556* (2013.01); *H01L 27/11582* (2013.01)

(58) Field of Classification Search
CPC ........... H01L 23/5283; H01L 27/11556; H01L 27/11582
USPC ........................ 365/185.01–185.33
See application file for complete search history.

(56) References Cited

U.S. PATENT DOCUMENTS

| | | | |
|---|---|---|---|
| 2009/0267128 A1 | 10/2009 | Maejima | |
| 2009/0268522 A1 | 10/2009 | Maejima | |
| 2010/0214838 A1 | 8/2010 | Hishida et al. | |
| 2011/0204475 A1* | 8/2011 | Rui | C01G 23/047 257/532 |
| 2011/0284946 A1 | 11/2011 | Kiyotoshi | |
| 2012/0069663 A1 | 3/2012 | Itagaki et al. | |
| 2012/0156889 A1* | 6/2012 | Chen | H01L 21/02186 438/761 |
| 2013/0037913 A1* | 2/2013 | Chen | H01L 28/40 257/532 |
| 2013/0141971 A1 | 6/2013 | Hosono | |
| 2015/0287706 A1* | 10/2015 | Sukekawa | H01L 25/18 257/390 |

FOREIGN PATENT DOCUMENTS

JP 2011-138945 7/2011

* cited by examiner

*Primary Examiner* — Harry W Byrne
(74) *Attorney, Agent, or Firm* — Oblon, McClelland, Maier & Neustadt, L.L.P.

(57) ABSTRACT

According to one embodiment, a semiconductor memory device includes a wiring layer, an insulating layer, a contact plug, a pillar and a pad. The wiring layer is electrically connected to a memory cell. The insulating layer is provided on the wiring layer. The contact plug is provided in the insulating layer and is electrically connected to an end of the wiring layer. The pillar is provided through the wiring layer and the insulating layer which are located between the memory cell and the contact plug. The pad is electrically connected to one end of the pillar.

13 Claims, 7 Drawing Sheets

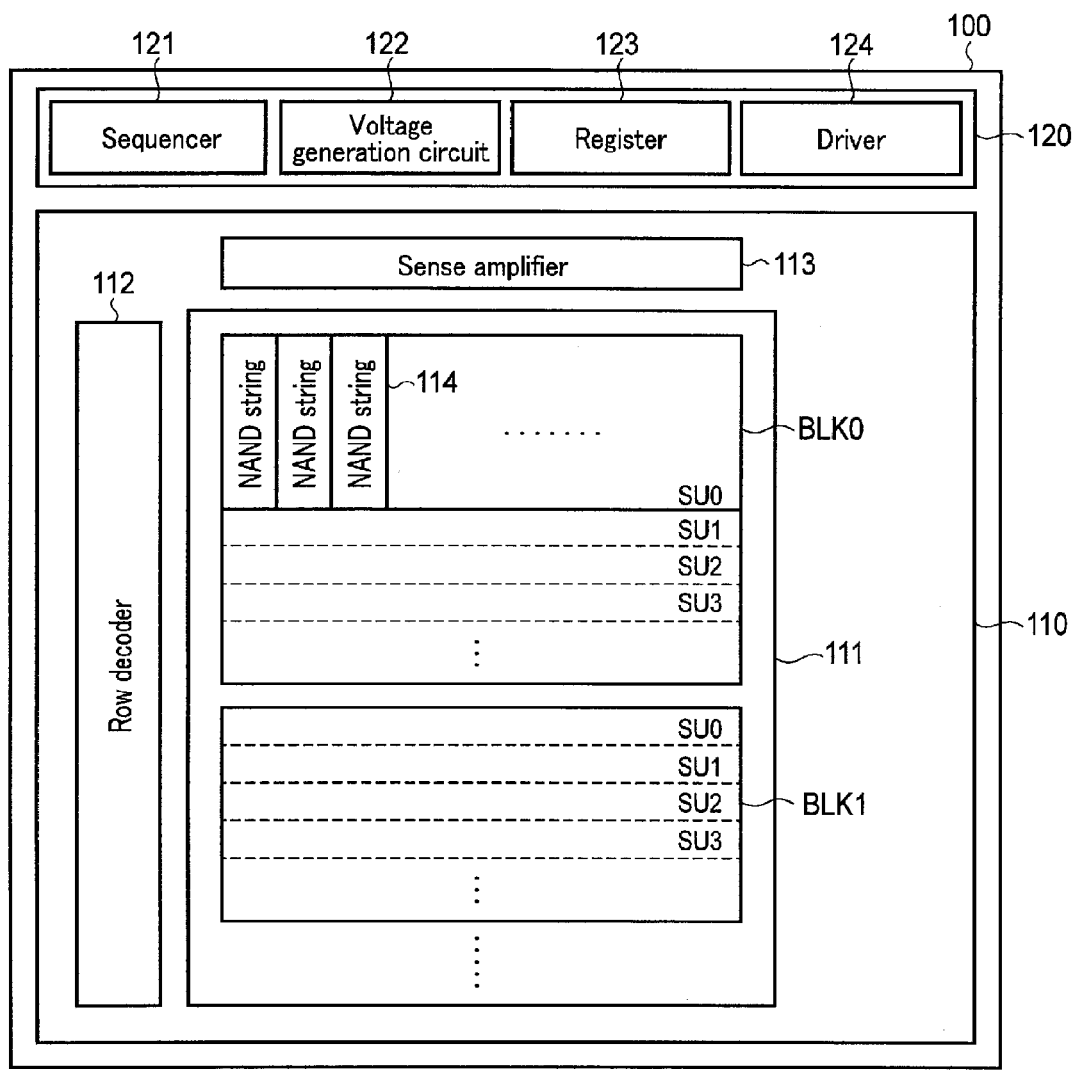
F I G. 1

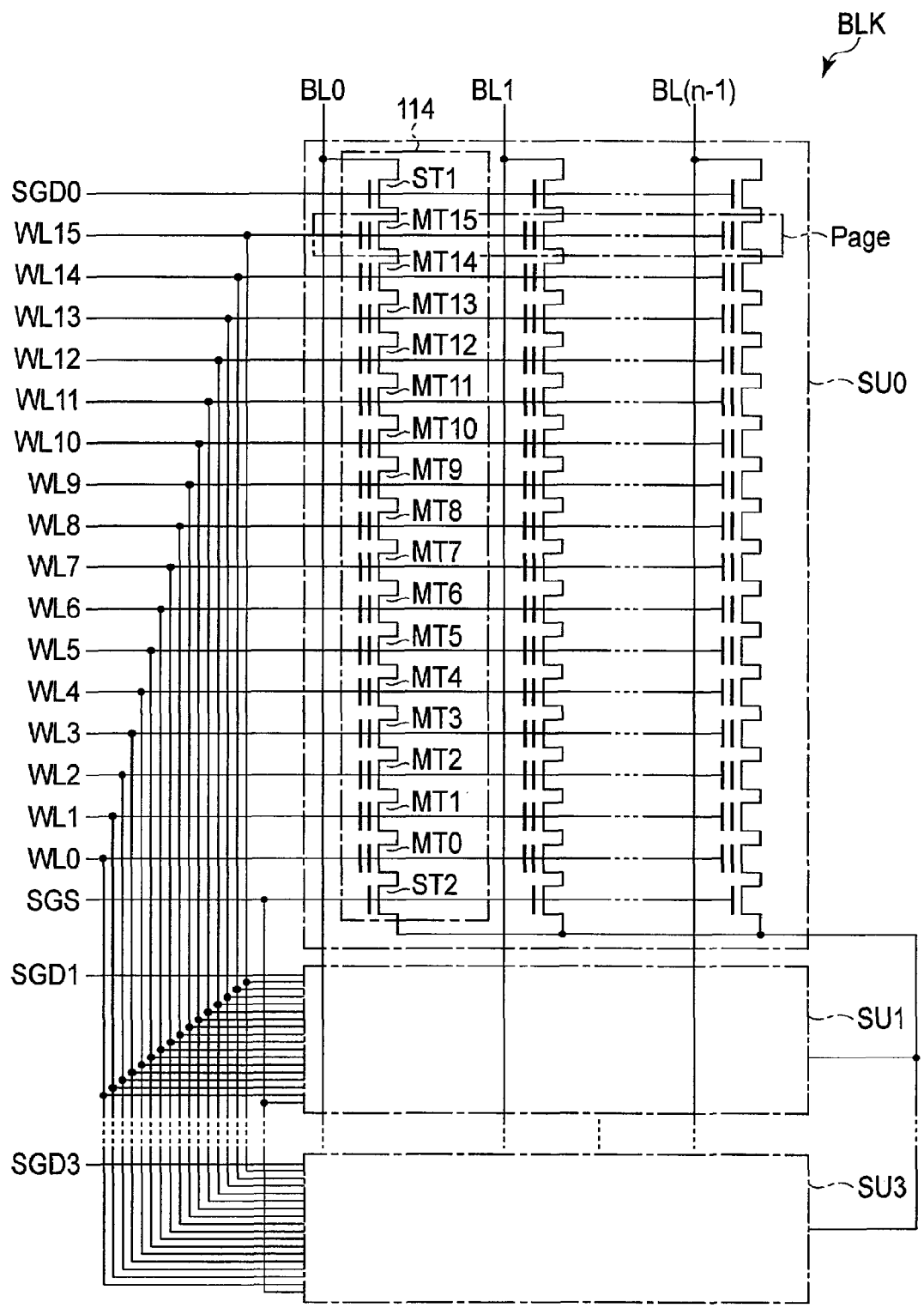
F I G. 2

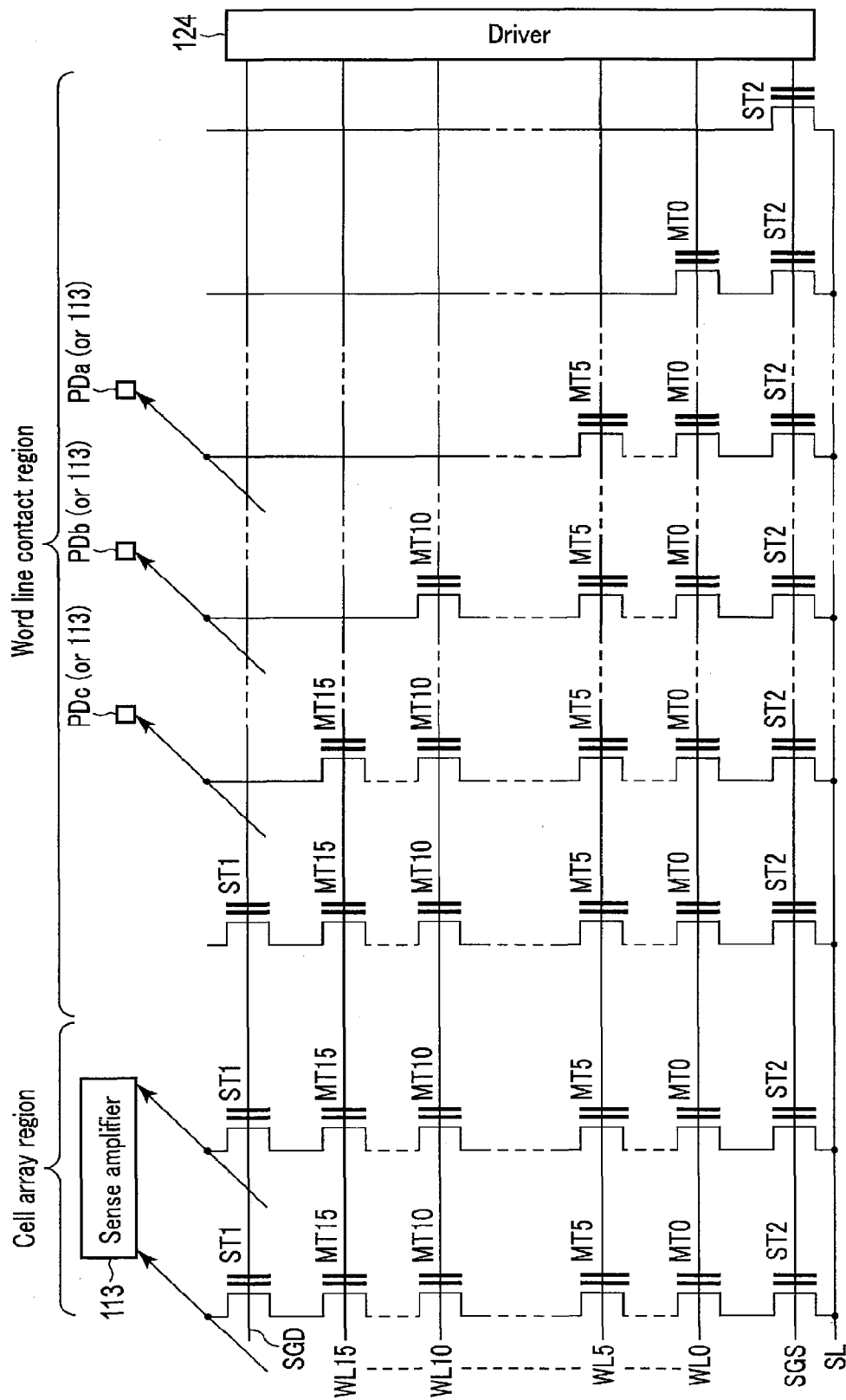
F I G. 5

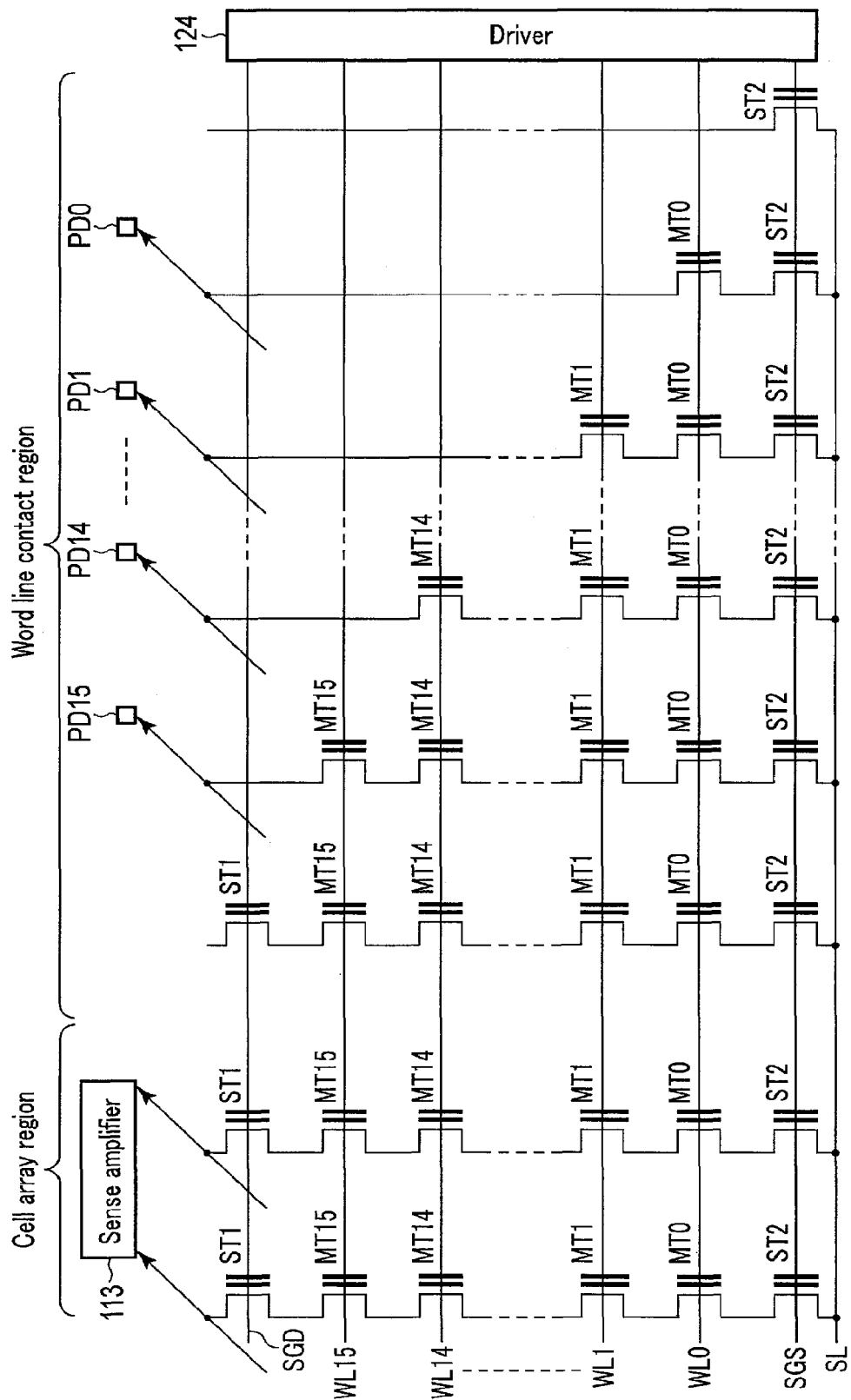
F I G. 7

SEMICONDUCTOR MEMORY DEVICE

CROSS-REFERENCE TO RELATED APPLICATIONS

This application is based upon and claims the benefit of priority from Japanese Patent Application No. 2016-053649, filed Mar. 17, 2016, the entire contents of which are incorporated herein by reference.

FIELD

Embodiments described herein relate generally to a semiconductor memory device.

BACKGROUND

As a semiconductor memory device, a NAND flash memory wherein memory cells are arranged three-dimensionally is known in the art.

BRIEF DESCRIPTION OF THE DRAWINGS

FIG. 1 is a block diagram illustrating an overall configuration of a semiconductor memory device according to an embodiment.

FIG. 2 is a circuit diagram of the semiconductor memory device of the embodiment.

FIG. 5 is a circuit diagram of the word line contact region of the semiconductor memory device of the embodiment.

FIG. 7 is a circuit diagram of the word line contact region of the modification.

DETAILED DESCRIPTION

Figure 3:
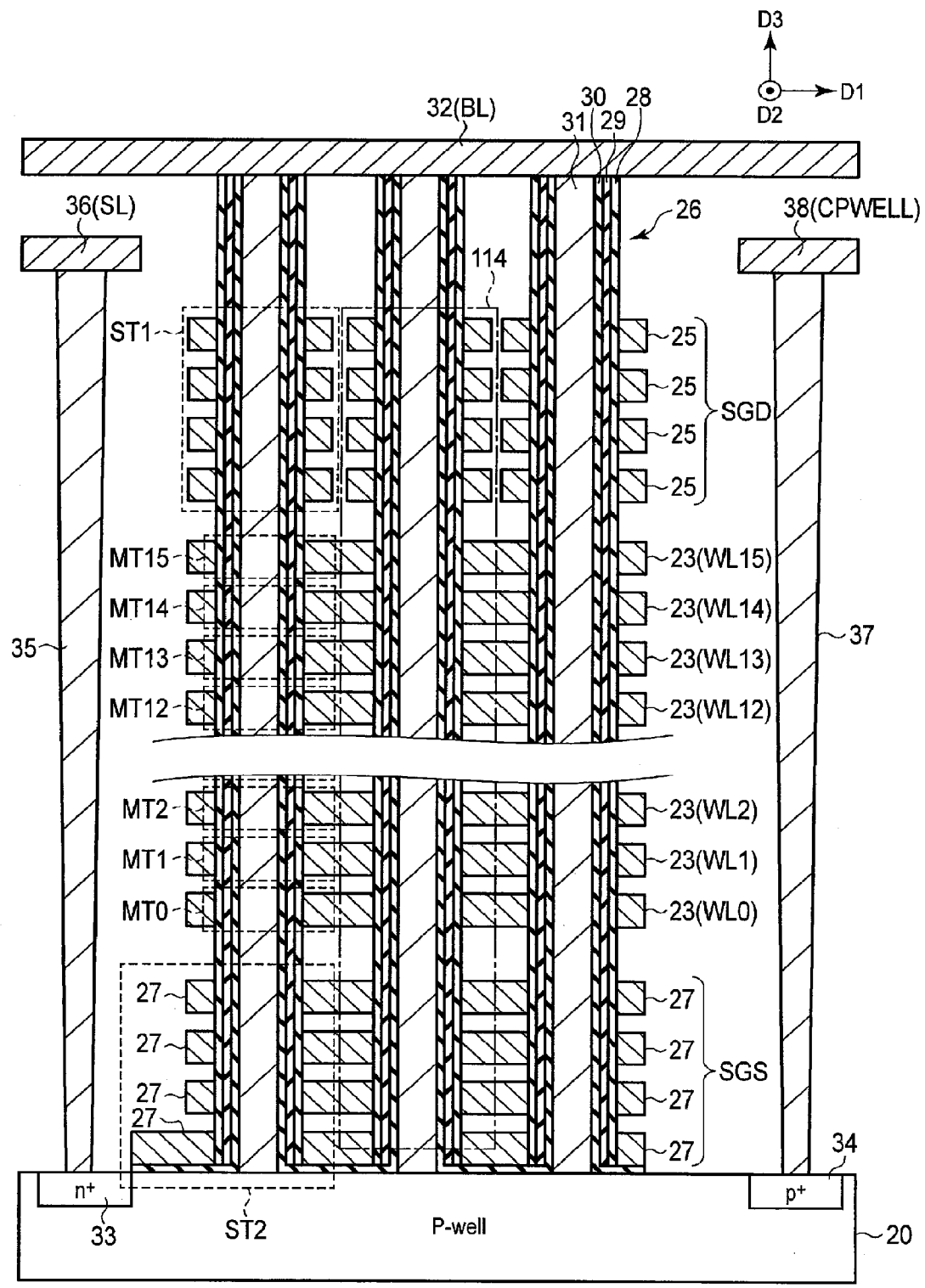
FIG. 3 is a sectional view of a memory cell array of the semiconductor memory device of the embodiment.

In general, according to one embodiment, a semiconductor memory device comprises a wiring layer, an insulating layer, a contact plug, a pillar and a pad. The wiring layer is electrically connected to a memory cell. The insulating layer is provided on the wiring layer. The contact plug is provided in the insulating layer and is electrically connected to an end of the wiring layer. The pillar is provided through the wiring layer and the insulating layer which are located between the memory cell and the contact plug. The pad is electrically connected to one end of the pillar.

Embodiments will be described with reference to the accompanying drawings. In the descriptions below, structural elements having similar functions and configurations will be denoted by the same reference symbols. The semiconductor memory cell will be described, referring to a three-dimensionally stacked NAND-type flash memory wherein a memory cell transistor is stacked above a semiconductor substrate.

[1] First Embodiment

A semiconductor memory device according to the present embodiment will be described.

[1-1] Overall Configuration of Semiconductor Memory Device

The overall configuration of the semiconductor memory device according to the present embodiment will be described with reference to FIG. 1.

As shown in FIG. 1, a NAND-type flash memory 100 comprises a core section 110 and a peripheral circuit 120.

The core section 110 includes a memory cell array 111, a row decoder 112 and a sense amplifier 113.

The memory cell array 111 includes a plurality of blocks BLK0, BLK1, . . . , each of which is a set including a plurality of nonvolatile memory cell transistors. In the descriptions below, "block BLK" is assumed to indicate each of the blocks BLK0, BLK1, . . . . Block BLK is, for example, an erasing unit of data, and the data in one block BLK can be erased at a time. The memory cell array 111 may contain any number of blocks.

"Block BLK" includes a plurality of string units SU0, SU1, SU2, SU3, . . . . Each of the string units includes a plurality of NAND strings 114. The configuration of Block BLK will be described later.

When data is written or read, the row decoder 112 decodes the address of block BLK and the address of a page and selects a word line corresponding to the page for which data is written or read. The row decoder 112 transfer proper voltages to the selected word line WL, non-selected word line WL, and select gate lines and SGD and SGS.

When data is read, the sense amplifier 113 senses and amplifies data read from the memory cell transistor MT to bit line BL. When data is written, the sense amplifier 113 transfers write data to the memory cell transistor MT. Data is read and written with reference to the memory cell arrays 111 in units of pages.

The peripheral circuit 120 includes a sequencer 121, a voltage generation circuit 122, and a register 123, and a driver 124.

The sequencer 121 controls the overall operation of the NAND-type flash memory 100.

The voltage generation circuit 122 generates voltages required for data writing, data reading and data erasing, and applies them to the row decoder 112, sense amplifier 113, driver 124, etc.

The register 123 retains various signals. For example, the register 123 retains a status of data writing and a status of erasing operation, and notifies an external controller as to whether an operation ends normally, based on the statuses. The register 123 may be configured to retain a command and an address received from the controller and to retain a variety of tables.

The driver 124 outputs the voltages required for data writing, data reading and data erasing to the row decoder 112, sense amplifier 113 and source line SL. The row decoder 112 and the sense amplifier 113 transfer the voltages supplied from the driver 124 to the memory cell transistor MT.

[1-2] Configuration of Memory Cell Array

Next, a detailed description will be given of the configuration of the memory cell array 111 of the NAND-type flash memory 100.

[1-2-1] Circuit of Memory Cell Array

FIG. 2 is a circuit diagram showing block BLK (each of blocks BLK0, BLK1, . . . ) of the memory cell array 111.

As shown in FIG. 2, block BLK includes, for example, four string units SU0, SU1, SU2 and SU3. Further, each of the string units includes a plurality of NAND strings 114. Each block BLK may include any number of string units SU, and each string unit SU may include any number of NAND strings 114. In the descriptions below, "string unit SU" is assumed to indicate each of the string units SU0 to SU3.

Each of the NAND strings 114 includes, for example, 16 memory cell transistors MT0, MT1, . . . , MT15 and two select transistors ST1 and ST2. Dummy transistors may be provided between memory cell transistor MT0 and select transistor ST2 and between memory cell transistor MT15 and select transistor ST1. In the descriptions below, "memory cell transistor MT" is assumed to indicate each of the memory cell transistors MT0 to MT15, and "select transistor ST" is assumed to indicate each of the select transistor ST1 and ST2.

Memory cell transistor MT is provided with a stack gate including a control gate and a charge storage layer, and retains data in a nonvolatile manner. Memory cell transistor MT may be a Metal-Oxide-Nitride-Oxide-Silicon (MONOS) type wherein a charge storage layer uses an insulating film; alternatively, it may be a Floating Gate (FG) type wherein a charge storage layer uses a conductive film. In the present embodiment, it is assumed that memory cell transistor MT is a MONOS type. The number of memory cell transistors MT is not limited to 16 but may be 8, 32, 64 or 128. That is, the number of memory cell transistors MT is not limited to a specific value. In addition, the number of select transistor provided may be any value.

Memory cell transistors MT0 to MT15 are connected in series between the select transistor ST1 and ST2, with their sources or drains. The drain of memory cell transistor MT15, which is at one end of the series connection, is connected to the source of select transistor ST1, and the source of memory cell transistor MT0, which is at the other end of the series connection, is connected to the drain of select transistor ST2.

The gates of select transistors ST1 of string units SU0 to SU3 are connected to select gate lines SGD0, SGD1, SGD2 and SGD3, respectively. In the descriptions below, "select gate line SGD" is assumed to indicate each of the select gate lines SGD0 to SGD3. The gates of select transistors ST1 of the same string unit SU are connected in common to the same select gate line SGD. On the other hand, the gates of select transistors ST2 of different string units are connected in common to the same select gate line SGS. The control gates of the memory cell transistors MT0 to MT15 in the same block are connected to word lines WL0 to WL15, respectively.

In other words, word lines WL0 to WL15 and select gate lines SGS of the same block BLK are connected in common in the string units SU of the same block BLK, whereas the select gate lines SGD in the string units SU are connected independently even though the string units SU are those of the same block.

Of the NAND strings 114 arranged in the matrix pattern of the memory cell array 111, the NAND strings 114 of the same row are configured such that the drains of select transistors ST1 are connected in common to a given one of bit lines BL0, BL1, . . . , BL(n−1). The symbol "n" is a natural number not less than 1. In the descriptions below, "bit line BL" is assumed to indicate each of the bit lines BL0 to BL(n−1). Bit line BL is connected to NAND string 114 in each of the blocks BLK. The sources of select transistors ST2 are connected in common to source line SL. In other words, source line SL is connected to NAND string 114 in each of the blocks BLK.

Data reading or data writing is performed at a time for a plurality of memory cell transistors MT, which are connected to a given word line WL of a given string unit SU of a given block. This unit is referred to as "page."

A configuration of a memory cell array of a three-dimensionally stacked nonvolatile semiconductor memory is described, for example, in U.S. patent application Ser. No. 12/407,403 filed on Mar. 19, 2009 and entitled "THREE-DIMENSIONALLY STACKED NONVOLATILE SEMICONDUCTOR MEMORY." Such a configuration is also described in U.S. patent application Ser. No. 12/406,524 filed on Mar. 18, 2009 and entitled "THREE-DIMENSIONALLY STACKED NONVOLATILE SEMICONDUCTOR MEMORY", U.S. patent application Ser. No. 13/816,799 filed on Sep. 22, 2011 and entitled "NONVOLATILE SEMICONDUCTOR MEMORY DEVICE", and U.S. patent application Ser. No. 12/532,030 filed on Mar. 23, 2009 and entitled "SEMICONDUCTOR MEMORY AND MANUFACTURING METHOD THEREOF." The entire contents of these applications are incorporated herein by reference.

The range in which data is erased is not limited to one block BLK. That is, a plurality of blocks may be erased at a time, or a partial region within one block BLK may be erased at a time. How data is erased is described, for example, in U.S. patent application Ser. No. 12/694,690 filed on Jan. 27, 2010 and entitled "NONVOLATILE SEMICONDUCTOR MEMORY DEVICE." How data is erased is also described in U.S. patent application Ser. No. 13/235,389 filed on Sep. 18, 2011 and entitled "NONVOLATILE SEMICONDUCTOR MEMORY DEVICE." The entire contents of these applications are also incorporated herein by reference.

[1-2-2] Configuration of Memory Cell Array

A sectional structure of part of the memory cell array 111 of the embodiment will be described with reference to FIG. 3.

As depicted in FIG. 3, a plurality of NAND strings 114 are provided above a p-type well region 20. To be more specific, a plurality of wiring layers 27 functioning as select gate lines SGS, a plurality of wiring layer 23 functioning as word lines WL and a plurality of wiring layers 25 functioning as select gate lines SGD are provided above the well region 20 in the D3 direction.

A memory hole 26 extending through these wiring layers 25, 23 and 27 and reaching the well region 20 is formed. A block insulation film 28, a charge storage layer (e.g., an insulation film) 29, and a gate insulation film 30 are formed on the side wall of the memory hole 26 in the order mentioned. A semiconductor layer (or conductive layer) 31 is embedded in the memory hole 26. The semiconductor layer 31 functions as a current path of the NAND string 114 and forms a channel when memory cell transistor MT and select transistor ST operate.

A plurality of wiring layers 27 (four layers in the present embodiment) of each NAD string 114 are electrically connected in common to one select gate line SGS. In other words, the four wiring layers 27 function as the gate electrode of one select transistor ST2 in practice. This holds true of select transistor ST1 (four select gates SGD) as well.

With the above configuration, in each NAND string 114, select transistor ST2, a plurality of memory cell transistors MT and select transistor ST1 are sequentially stacked on the well region 20.

In the example depicted in FIG. 3, select transistor ST is provided with a charge storage layer 29, just like memory cell transistor MT. It should be noted, however, that in practice, select transistor ST does not function as a memory cell for storing data but functions as a switch. Therefore, the threshold based on which select transistor ST is turned on/off may be controlled by injecting charges into the charge storage layer 29.

A wiring layer 32 functioning as a bit line BL is provided on the upper end of the semiconductor layer 31. The bit line BL extends in the D1 direction and is connected to the sense amplifier 113.

An $n^+$-type impurity diffusion layer 33 and a $p^+$-type impurity diffusion layer 34 are formed in the surface region of the well region 20. A contact plug 35 is provided on diffusion layer 33, and a wiring layer 36 functioning as source line SL is provided on the contact plug 35. The source line SL extends in the D2 direction. A contact plug 37 is provided on diffusion layer 34, and a wiring layer 38 functioning as well wiring CPWELL is provided on the contact plug 37. Wiring layers 36 and 38 are upper in level than select gate line SGD and are lower in level than wiring layer 32.

A plurality of configurations each of which is as described above are arranged in the direction perpendicular to the drawing sheet of FIG. 3 (i.e., in the D2 direction), and a plurality of NAND strings 114 arranged in the D2 direction constitute a string unit SU. The wiring layers 27 functioning as a plurality of select gate lines SGS included in the same block are connected in common. That is, the gate insulation film 30 is formed on the well regions 20 of the adjacent NAND strings 114, and the wiring layer 27 and gate insulation film 30 adjacent to diffusion layer 33 are formed up to a position in the vicinity of diffusion layer 33.

Therefore, the channel which select transistor ST2 forms when it is turned on electrically connects memory cell transistor MT0 and diffusion layer 33 to each other. The semiconductor layer 31 is given a potential by applying a voltage to the wiring layer (CPWELL) 38. Incidentally, in FIG. 3, illustration of an interlayer insulation film between the p-type well 20 and the wiring layer 32 is omitted.

[1-2-3] Configuration of Word Line Contact Region (Stepwise Region)

Word line WL is electrically connected to an upper wiring provided above the word line by means of a contact plug, in the region outside memory cell transistor MT (or in an end region of word line WL). In the descriptions below, the region where word line WL and the upper wiring are connected by means of the contact plug will be referred to as a "word line contact region."

Figure 4:
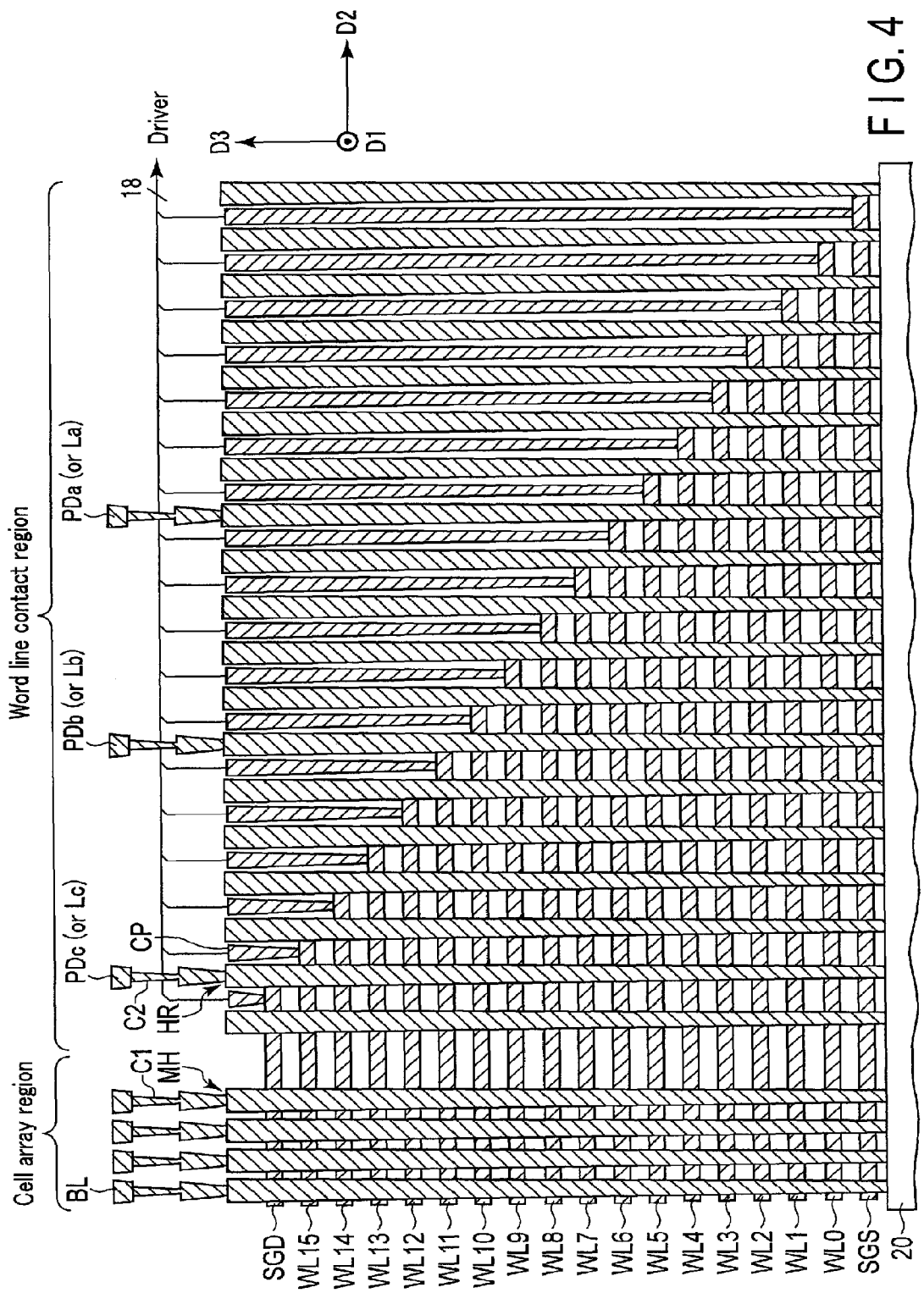
FIG. 4 is a sectional view of a word line contact region of the semiconductor memory device of the embodiment.

A sectional structure of the word line contact region of the embodiment will be described with reference to FIG. 4. FIG. 4 is a sectional view taken along the word lines in string unit SU (i.e., in the D2 direction perpendicular to bit line BL). In FIG. 4, the four-layered select gate lines SGS and SGD shown in FIG. 3 are depicted as single layers, respectively. In FIG. 4, illustration of an interlayer insulation film provided on the p-type well region 20 is omitted, for the sake of simplicity.

As shown in FIG. 4, select gate line SGS, word lines WL0-WL15 and select gate line SGD are arranged on the p-type well region 20 in the D3 direction.

In the cell array region, a memory hole (or a pillar) MH is provided to extend through select gate line SGD, word lines WL0 to WL15 and select gate line SGS. A bit line BL is provided at the upper end of memory hole MH by means of contact plug C1. Each bit line BL is electrically connected to the sense amplifier 113. Source line SL (not shown) is electrically connected to the lower end of memory hole MH.

In the word line contact region, ends of select gate line SGS, word lines WL0 to WL15 and select gate line SGD are extended in the D2 direction by respective lengths. The extended portions of the select gate lines and word lines form a stepwise sectional structure. In the descriptions below, the extended ends of select gate line SGS, word lines WL0 to WL15 and select gate line SGD will be referred to as "lead portions", and the region where the stepwise sectional structure is provided will be referred to as a "stepwise region."

An interlayer insulation film (not shown) is formed on the lead portions of select gate line SGS, word lines WL0 to WL15 and select gate line SGD. Contact plugs CP formed in the interlayer insulation film are provided for the respective lead portions. The contact plugs are electrically connected to the driver 124 by way of the row decoder 112. That is, the lead portions of select gate line SGS, word lines WL0 to WL15 and select gate line SGD are electrically connected to the driver 124.

Pillars HR are provided to extend through select gate line SGD, word lines WL0 to WL15 and select gate line SGS. In the step of forming word lines WL, the pillars HR serve to support the interlayer insulation film and thus prevent the interlayer insulation film in the word line contact region from being deformed.

A contact plug C2 is provided at the upper end of each pillar HR, and electrode pads (or wirings) are provided on the contact plug C2. For example, electrode pads PDa, PDb and PDc (or wirings La, Lb and Lc) are provided on the upper ends of respective pillars HR by means of contact plugs C2 such that electrode pads PDa, PDb and PDc are arranged at intervals corresponding to a predetermined number of pillars HR (or a predetermined number of contact plugs CP). In the descriptions below, "electrode pad PD" (or "wiring L") is assumed to indicate each of the electrode pads PDa to PDc (or each of the wirings La to Lc). The number of electrode pads PD (wirings L) provided in the word line contact region may be freely determined. Wirings L are electrically connected to sense amplifier 113.

A source line SL (not shown) is electrically connected to the lower end of each pillar HR. Where the pillar HR is formed simultaneously with the memory hole MH, the pillar HR contains a block insulation film 28, a charge storage layer (insulation film) 29, a gate insulation film 30 and a semiconductor layer 31, like the memory hole MH shown in FIG. 3. The pillar HR may be formed simultaneously with the memory hole MH; alternatively, it may be formed in a different step from that of the memory hole MH. Where the pillar is formed in the different step, the pillar HR is only required to include at least an insulation film and a semiconductor layer arranged within the insulation film.

[1-2-4] Circuit Configuration of Word Line Contact Region

A circuit configuration of the word line contact region shown in FIG. 4 will be described with reference to FIG. 5. In the word line contact region, a transistor is formed at the intersection between word line WL and pillar HR, as in the cell array region where memory cell transistor MT is formed at the intersection between word line WL and memory hole MH. Although the transistor in the word line contact region does not store data, it will be referred to as a memory cell transistor herein.

As shown in FIG. 5, the first column of select transistor and memory cell transistors in the neighborhood of the cell array region are connected as follows. Select transistor ST1, memory cell transistors MT15 to MT0 and select transistor ST2 are connected in series, with their sources or drains. The drain of select transistor ST1 is not electrically connected to any element (non-connected state). The source of select transistor ST2 is electrically connected to source line SL.

In the second column, select transistor ST1 is not provided, and memory cell transistors MT15 to MT0 and select transistor ST2 are connected in series, with their sources or drains. The drain of memory cell transistor MT15 is electrically connected to electrode pad PDc (or sense amplifier 113). The source of select transistor ST2 is electrically connected to source line SL.

In the third to fifth columns, the number of memory cell transistors MT provided is decreased one by one, and provided memory cell transistors MT and select transistor ST2 are connected in series, with their sources or drains. The drain of the memory cell transistor located at the uppermost end is not electrically connected to any element (non-connected state). The source of select transistor ST2 is electrically connected to source line SL.

In the sixth column, memory cell transistors MT10 to MT0 and select transistor ST2 are connected in series, with their sources or drains. The drain of memory cell transistor MT10 is electrically connected to electrode pad PDb (or sense amplifier 113). The source of select transistor ST2 is electrically connected to source line SL.

In the seventh to tenth columns, the number of memory cell transistors MT provided is decreased one by one, and provided memory cell transistors MT and select transistor ST2 are connected in series, with their sources or drains. The drain of memory cell transistor MT located at the uppermost end is not electrically connected to any element (non-connected state). The source of select transistor ST2 is electrically connected to source line SL.

In the eleventh column, memory cell transistors MT5 to MT0 and select transistor ST2 are connected in series, with their sources or drains. The drain of memory cell transistor MT5 is electrically connected to electrode pad PDa (or sense amplifier 113). The source of select transistor ST2 is electrically connected to source line SL.

In the twelfth and subsequent columns, the number of memory cell transistors MT provided is decreased one by one, and provided memory cell transistors MT and select transistor ST2 are connected in series, with their sources or drains. The drain of memory cell transistor MT located at the uppermost end is not electrically connected to any element (non-connected state). The source of select transistor ST2 is electrically connected to source line SL.

The gates of select transistors ST1 are connected in common to select gate line SGD. The gates of select transistors ST2 are connected in common to select gate line SGS. The gates of memory cell transistors MT0 to MT15 are connected to word lines WL0 to WL15, respectively. Select gate lines SGD and SGS and word lines WL0 to WL15 are electrically connected to the driver 124.

[1-3] Open Detection Operation of Word Lines

A description will now be given as to how disconnection of a word line WL is detected in the word line contact region (stepwise region).

As described above, in the word line contact region, for example, electrode pads PDa, PDb and PDc are electrically connected to the upper ends of respective pillars HR, which are arranged at intervals corresponding to a predetermined number of pillars HR. It is assumed here that select gate lines SGD and SGS are not disconnected.

First, the driver 124 applies voltage VSG (e.g., 5V) to select gate lines SGD and SGS. Voltage VSG is high enough to turn on select transistors ST1 and ST2 in the word line contact region. Next, the driver 124 applies voltage VREAD (e.g., 7V) to all word lines WL0 to WL15. Voltage VREAD is high enough to turn on memory transistors MT in the word line contact region. Currents Ia, Ib and Ic flowing through electrode pads PDa, PDb and PDc are measured then.

Then, voltage VREAD is lowered to voltage Vss (e.g., 0V) with respect to detection-target word lines included in word lines WL0 to WL15. Currents Ia, Ib and Ic flowing through electrode pads PDa, PDb and PDc are measured then.

Whether or not disconnection of detection-target word line WL occurs is detected by checking whether currents Ia, Ib and Ic flowing when voltage VREAD is applied are different from currents Ia, Ib and Ic flowing when voltage Vss is applied.

Assuming that word line WL0 is a detection-target word line, detection is performed as follows.

If all currents Ia, Ib and Ic remain the same when voltage VREAD applied to word line WL0 is lowered to voltage Vss, it can be determined that disconnection occurs at a position on the external side of electrode pad PDa of word line WL0 (i.e., on the side opposite to the cell array region).

If current Ia decreases and currents Ib and Ic remain the same, it can be determined that disconnection occurs at a position between electrode pad PDa and electrode pad PDb of word line WL0.

If currents Ia and Ib decrease and current Ic remains the same, it can be determined that disconnection occurs at a position between electrode pad PDb and electrode pad PDc of word line WL0.

If all currents Ia, Ib and Ic decrease, it can be determined that no disconnection occurs in word line WL0.

Assuming that word line WL8 is a detection-target word line, detection is performed as follows.

If all currents Ia, Ib and Ic remain the same when voltage VREAD applied to word line WL8 is lowered to voltage Vss, it can be determined that disconnection occurs at a position between electrode pad PDa and electrode pad PDb of word line WL8.

If current Ib decreases and currents Ia and Ic remain the same, it can be determined that disconnection occurs at a position between electrode pad PDb and electrode pad PDc of word line WL8.

If currents Ib and Ic decrease and current Ia remains the same, it can be determined that no disconnection occurs in word line WL8.

Assuming that word line WL13 is a detection-target word line, detection is performed as follows.

If all currents Ia, Ib and Ic remain the same when voltage VREAD applied to word line WL13 is lowered to voltage Vss, it can be determined that disconnection occurs at a position between electrode pad PDb and electrode pad PDc of word line WL13.

If current Ic decreases and currents Ia and Ib remain the same, it can be determined that no disconnection occurs in word line WL13.

The disconnection of the other word lines WL can be determined in a similar manner.

If a determination is made simply to detect which word line WL is disconnected and a point of disconnection need not be located, then only electrode pads PDc connected to pillars HR extending through all word lines WL are provided, and electrode pads PDa and PDb need not be provided. In this case as well, whether or not disconnection of detection-target word line WL occurs is detected by checking whether current Ic flowing when voltage VREAD is applied is different from current Ic flowing when voltage Vss is applied.

When memory hole MH and pillar HR are formed in different steps, a semiconductor layer provided in the pillar HR may be formed of a semiconductor doped with impurities. By providing such a semiconductor layer, the pillar HR is normally conductive but does not permit a current to flow therethrough when a voltage is applied to word line WL. With this configuration, a detection method described below can be provided.

The driver 124 applies voltage Voff to a detection-target word line, which is one of word lines WL0 to WL15. Voltage Voff is a voltage that turns off memory transistors MT in the word line contact region. Currents Ia, Ib and Ic flowing through the electrode pads PDa, PDb and PDc are measured. Based on whether or not currents Ia, Ib and Ic can be detected, the disconnection of a word line is determined as follows.

If all currents Ia, Ib and Ic are detected, it is determined that at least disconnection occurs in the word lines WL0 to WL5 located on the external side of electrode pad PDa (i.e., on the side opposite to the cell array region).

If current Ia is not detected and currents Ib and Ic are detected, it is determined that at least disconnection occurs in the word lines WL0 to WL10 located between electrode pad PDa and electrode pad PDb.

If currents Ia and Ib are not detected and current Ic is detected, it is determined that at least disconnection occurs in the word lines WL0 to WL15 located between electrode pad PDb and electrode pad PDc.

If none of currents Ia, Ib and Ic are detected, it is determined that no disconnection occurs in the word lines WL0 to WL15 located on the external side of electrode pad PDc (i.e., on the side opposite to the cell array region).

If a determination is made simply to detect which word line WL is disconnected and a point of disconnection need not be located, then only electrode pads PDc connected to pillars HR extending through all word lines WL are provided, and electrode pads PDa and PDb need not be provided. In this case as well, disconnection of a detection-target word line can be detected by checking whether or not current Ic flows when voltage Voff is applied to a detection-target word line WL.

Currents Ia to Ic can be measured, for example, as follows. Where electrode pads PDa to PDc are connected to pillars HR, currents Ia to Ic can be measured using a tester or the like. Specifically, the measurement needle of the tester is brought into contact with the electrode pads PDa to PDc, and currents flowing through the electrode pads PDa to PDc are measured. Where the sense amplifier 113 is connected to pillars HR by means of wirings La to Lc, currents Ia to Ic can be measured by permitting the sense amplifier 113 to sense the currents flowing through the wirings La to Lc.

[1-4] Advantage of Embodiment

According to the present embodiment, whether or not a disconnected word line exists can be determined for each of regions which are included in the word line contact region and in which a plurality of word lines are provided. To be specific, the disconnection of word line WL can be determined as to whether it occurs on the external side of electrode pad PDa, whether it occurs between electrode pad PDa and PDb, or whether it occurs between electrode pad PDb and PDc. Owing to this feature, a block containing a disconnected word line can be processed as a defective block. In addition, since a region where a word line is disconnected can be located, proper measures can be taken for that region in the succeeding processes.

[2] Modification

In the above embodiment, whether or not a disconnected word line exists is determined for each of regions in which a plurality of word lines are provided. In this modification, disconnection of a word line is detected for each of word lines. In the following, only the points different from those of the above embodiment will be described.

[2-1] Configuration of Word Line Contact Region

A sectional structure of the word line contact region of the modification will be described with reference to FIG. 6.

Figure 6:
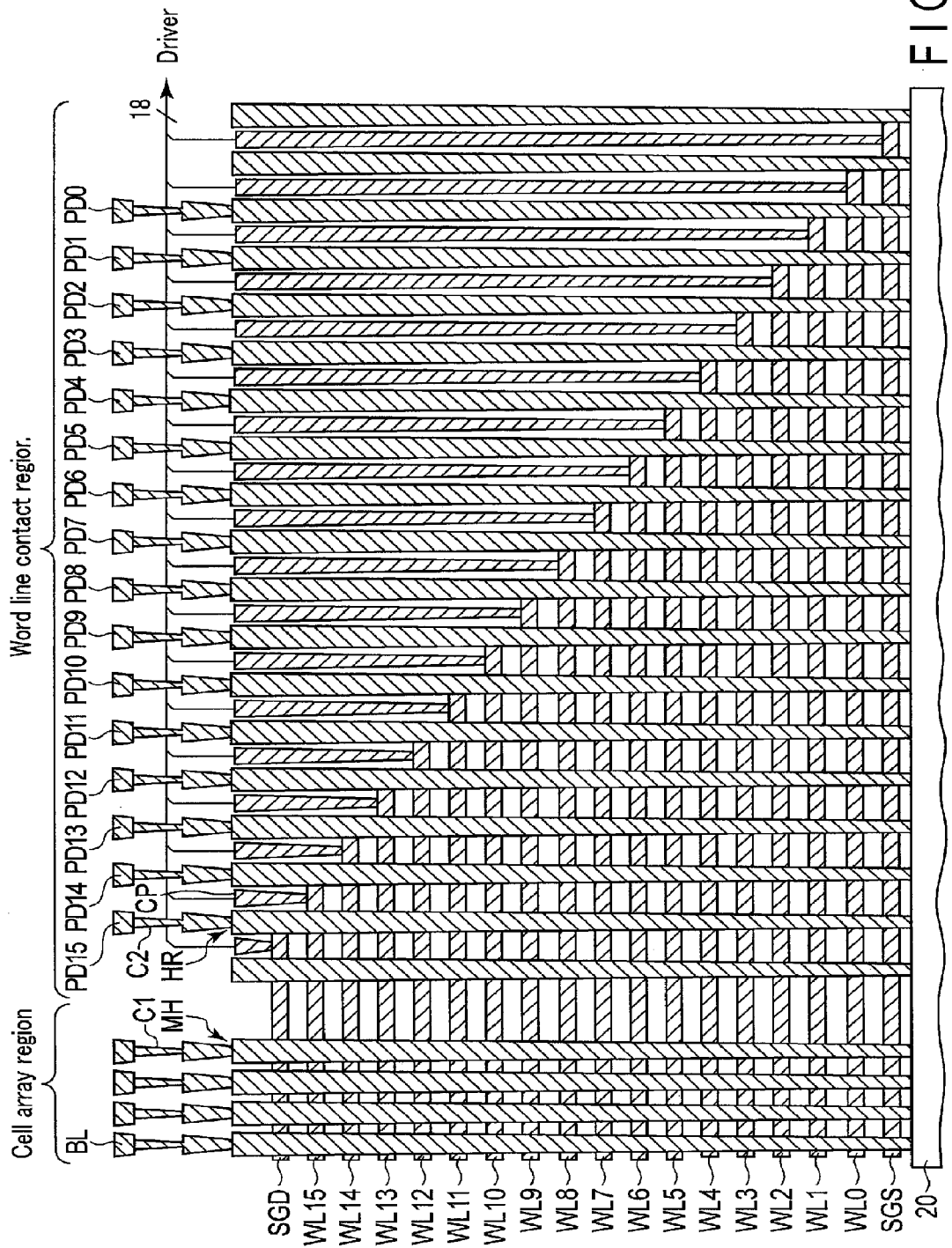
FIG. 6 is a sectional view of a word line contact region according to a modification.

As shown in FIG. 6, pillars HR are provided to extend through select gate line SGD, word lines WL0 to WL15 and select gate line SGS. Electrode pads PD0, PD1 . . . PD15 are provided on the upper ends of respective pillars HR by means of contact plugs C2. Although not shown in the drawings, wirings may be provided on the upper ends of the respective pillars HR by means of the contact plugs C2, and these wirings may be electrically connected to the sense amplifier 113. In the description of the modification, "electrode pad PD" is assumed to indicate each of the electrode pads PD0 to PD15.

[2-2] Circuit Configuration of Word Line Contact Region

A circuit configuration of the word line contact region shown in FIG. 6 will be described with reference to FIG. 7.

As shown in FIG. 7, memory cell transistors MT0 and select transistors ST2 are connected in series, with their sources or drains. The drains of memory cell transistors MT0 are electrically connected to electrode pad PD0. The sources of select transistors ST2 are electrically connected to source line SL.

Memory cell transistors MT1 and MT0 and select transistors ST2 are connected in series, with their sources or drains. The drains of memory cell transistors MT1 are electrically connected to electrode pad PD1. The sources of select transistors ST2 are electrically connected to source line SL.

Likewise, in the memory cell transistors and select transistors ST2 connected in series, the drains of memory cell transistors MT, which is at one end of the series connection, is electrically connected to electrode pad PD, and the sources of select transistors ST2, which is at the other end of the series connection, is electrically connected to source line SL.

[2-3] Open Detection Operation of Word Lines

A description will now be given as to how disconnection is detected for each of word lines WL in the word line contact region.

As described above, in the word line contact region of the modification, electrode pads PD0 to PD15 are electrically connected to the upper ends of the respective pillars HR.

First, the driver 124 applies voltage VSG (e.g., 5V) to select gate lines SGD and SGS. Next, the driver 124 applies voltage VREAD (e.g., 7V) to all word lines WL0 to WL15. Currents I_0 to I_15 flowing through the electrode pads PD0 to PD15 are measured then.

Next, voltage VREAD applied to word lines WL is lowered to voltage Vss with respect a detection-target word line. Currents I_0 to I_15 flowing through the electrode pads PD00 to PD15 are measured then.

Whether or not disconnection of the detection-target word line WL occurs is detected by checking whether currents I_0 to I_15 flowing when voltage VREAD is applied are different from currents Ia, Ib and Ic flowing when voltage Vss is applied.

Assuming that word line WL0 is a detection-target word line, detection is performed as follows.

If all currents I_0 to I_15 remain the same when voltage VREAD applied to word line WL0 is lowered to voltage Vss, it can be determined that disconnection occurs at a position on the external side of electrode pad PD0 of word line WL0 (i.e., on the side opposite to the cell array region).

For example, if currents I_0 to I_4 decrease and currents I_5 to I_15 remain the same, it can be determined that disconnection occurs at a position between electrode pad PD4 and electrode pad PD5 of word line WL0.

For example, if currents I_0 to I_10 decrease and currents I_11 to I_15 remain the same, it can be determined that disconnection occurs at a position between electrode pad PD10 and electrode pad PD11 of word line WL0.

Assuming that word line WL7 is a detection-target word line, detection is performed as follows.

If all currents I_0 to I_15 remain the same when voltage VREAD applied to word line WL7 is lowered to voltage Vss, it can be determined that disconnection occurs at a position on the external side of electrode pad PD7 of word line WL7 (i.e., on the side opposite to the cell array region).

For example, if currents I_7 to I_10 decrease and currents I_11 to I_15 remain the same, it can be determined that disconnection occurs at a position between electrode pad PD10 and electrode pad PD11 of word line WL7.

The disconnection of the other word lines WL can be determined in a similar manner.

[2-4] Advantages of Modification

According to the modification of the embodiment, disconnection of a word line can be detected for each word line, and the electrode pads between which the disconnection occurs can be identified. Since a disconnected word line can be located, proper measures can be taken for the region of the disconnected word line in the succeeding processes.

[3] Other Modifications

The above embodiment is applicable not only to a nonvolatile memory (e.g., a NAND-type flash memory), a volatile memory, a system LSI or the like but also a variety of semiconductor devices, provided that a plurality of conductive layers are stacked and each of the stacked conductive layers is connected to an upper-level wiring.

As described above, the embodiment can provide a semiconductor memory device that enables disconnection of a word line to be detected in a contact region where a plurality of word lines are arranged stepwise and are connected to an upper-level wiring.

While certain embodiments have been described, these embodiments have been presented by way of example only, and are not intended to limit the scope. Indeed, the novel methods and systems described herein may be embodied in a variety of other forms; furthermore, various omissions, substitutions and changes in the form of the methods and systems described herein may be made without departing from the spirit. The accompanying claims and their equivalents are intended to cover such forms or modifications as would fall within the scope and spirit.

What is claimed is:

1. A semiconductor memory device comprising:
a wiring layer electrically connected to a memory cell;
an insulating layer provided on the wiring layer;
a contact plug provided in the insulating layer and electrically connected to an end of the wiring layer;
a pillar provided through the wiring layer and insulating layer which are located between the memory cell and the contact plug; and
a pad electrically connected to one end of the pillar.

2. The semiconductor memory device according to claim 1, wherein the pillar comprises a semiconductor layer and an insulating film provided on a side face of the semiconductor layer, and
a transistor is provided at an intersection between the wiring layer and the pillar.

3. The semiconductor memory device according to claim 2, wherein the contact plug is applied with a first voltage that turns on the transistor, and a current flowing through the pad is measured,
the contact plug is applied with a second voltage that turns off the transistor, and a current flowing through the pad is measured, and
whether the current flowing through the pad when the contact plug is applied with the second voltage varies from the current flowing through the pad when the contact plug is applied with the first voltage is detected.

4. The semiconductor memory device according to claim 3, further comprising:
a driver electrically connected to the contact plug,
wherein the driver applies either the first voltage or the second voltage to the contact plug.

5. A semiconductor memory device comprising:
a wiring layer electrically connected to a memory cell;
an insulating layer provided on the wiring layer;
a contact plug provided in the insulating layer and electrically connected to an end of the wiring layer;
a pillar provided through the wiring layer and insulating layer which are located between the memory cell and the contact plug; and
a sense amplifier electrically connected to one end of the pillar and configured to sense a current flowing through the pillar.

6. The semiconductor memory device according to claim 5, wherein the pillar comprises a semiconductor layer and an insulating film provided on a side face of the semiconductor layer, and
a transistor is provided at an intersection between the wiring layer and the pillar.

7. The semiconductor memory device according to claim 6, wherein the contact plug is applied with a first voltage that turns on the transistor, and the sense amplifier measures a first current flowing through the pillar,
the contact plug is applied with a second voltage that turns off the transistor, and the sense amplifier measures a second current flowing through the pillar, and
the sense amplifier detects whether the second current flowing when the contact plug is applied with the second voltage varies from the first current flowing when the contact plug is applied with the first voltage.

8. The semiconductor memory device according to claim 7, further comprising:
a driver electrically connected to the contact plug,
wherein the driver applies either the first voltage or the second voltage to the contact plug.

9. A semiconductor memory device comprising:
a first wiring layer electrically connected to a first memory cell;
a second wiring layer provided on the first wiring layer and connected to a second memory cell;
an insulating layer provided on the first and second wiring layers;
a first contact plug provided in the insulating layer and electrically connected to an end of the first wiring layer;
a second contact plug provided in the insulating layer and electrically connected to an end of the second wiring layer;
a first pillar provided through the first wiring layer and insulating layer which are located between the first memory cell and the first contact plug;

a second pillar provided through the second wiring layer and insulating layer which are located between the second memory cell and the second contact plug;

a first pad electrically connected to one end of the first pillar; and a second pad electrically connected to one end of the second pillar.

10. The semiconductor memory device according to claim 9, wherein the end of the first wiring layer to which the first contact plug is connected and the end of the second wiring layer to which the second contact plug is connected are arranged to form a stepwise structure in a cross section of the first and second wiring layers, the first pillar extends through the first wiring layer, and the second pillar extends through both the first wiring layer and the second wiring layer.

11. The semiconductor memory device according to claim 9, wherein the first pillar comprises a first semiconductor layer and a first insulating film provided on a side face of the first semiconductor layer, a first transistor is provided at an intersection between the first wiring layer and the first pillar, the second pillar comprises a second semiconductor layer and a second insulating film provided on a side face of the second semiconductor layer, and a second transistor is provided at an intersection between the second wiring layer and the second pillar.

12. The semiconductor memory device according to claim 11, wherein the first and second contact plugs are applied with a first voltage that turns on the first and second transistors, and a first current flowing through the first pad and a second current flowing through the second pad are measured, the first and second contact plugs are applied with a second voltage that turns off the first and second transistors, and the first current flowing through the first pad and the second current flowing through the second pad are measured, and whether or not the first and second currents flowing when the first and second contact plugs are applied with the second voltage vary from the first and second currents flowing when the first and second contact plugs are applied with the first voltage is detected.

13. The semiconductor memory device according to claim 12, further comprising:

a driver electrically connected to the first and second contact plugs, wherein the driver applies either the first voltage or the second voltage to the first and second contact plugs.

* * * * *